US009146331B2

(12) United States Patent
Saether

(10) Patent No.: US 9,146,331 B2
(45) Date of Patent: Sep. 29, 2015

(54) UNDERWATER MEASUREMENT SYSTEM

(75) Inventor: Frank Tore Saether, Bergen (NO)

(73) Assignee: BJORGE NAXYS AG, Bergen (NO)

( * ) Notice: Subject to any disclaimer, the term of this patent is extended or adjusted under 35 U.S.C. 154(b) by 417 days.

(21) Appl. No.: 12/734,784

(22) PCT Filed: Nov. 24, 2008

(86) PCT No.: PCT/NO2008/000420
§ 371 (c)(1),
(2), (4) Date: Jun. 11, 2010

(87) PCT Pub. No.: WO2009/067025
PCT Pub. Date: May 28, 2009

(65) Prior Publication Data
US 2010/0280773 A1    Nov. 4, 2010

(30) Foreign Application Priority Data

Nov. 23, 2007    (WO) .................. PCT/NO07/00414

(51) Int. Cl.
*G01V 3/08* (2006.01)
*G01R 31/00* (2006.01)
*G01R 31/08* (2006.01)
*G01V 3/00* (2006.01)
*G01R 31/02* (2006.01)
*G01R 31/12* (2006.01)

(52) U.S. Cl.
CPC .............. *G01V 3/088* (2013.01); *G01R 31/00* (2013.01); *G01R 31/021* (2013.01); *G01R 31/025* (2013.01); *G01R 31/08* (2013.01); *G01R 31/083* (2013.01); *G01R 31/12* (2013.01); *G01V 3/00* (2013.01)

(58) Field of Classification Search
CPC ......... G01V 3/088; G01V 3/00; G01R 31/00; G01R 31/021; G01R 31/08; G01R 31/12; G01R 31/083; G01R 31/025
See application file for complete search history.

(56) References Cited

U.S. PATENT DOCUMENTS

| | | | | |
|---|---|---|---|---|
| 4,371,957 A | * | 2/1983 | Sandoz et al. ................ | 367/3 |
| 5,919,689 A | * | 7/1999 | Selvig et al. ................ | 435/202 |
| 6,867,596 B1 | | 3/2005 | Mizuno | |
| 7,116,108 B2 | * | 10/2006 | Constable .................... | 324/350 |

(Continued)

FOREIGN PATENT DOCUMENTS

JP    2002372558    * 12/2002    ............. G01R 29/08

OTHER PUBLICATIONS

JP2002372558 Machine Translation.*

*Primary Examiner* — Janet Suglo
*Assistant Examiner* — L. Anderson
(74) *Attorney, Agent, or Firm* — Abelman, Frayne & Schwab

(57) ABSTRACT

There is provided an underwater measurement system (20, 30, 40) for monitoring an underwater region (10). The system (20, 30, 40) includes a sensor assembly operable to sense at least one physical variable in the region (10) for generating at least one corresponding sensor signal, and a data processing arrangement (170, 510, 520) for processing the at least one sensor signal to generate processed data for presentation and/or logging. The sensor assembly (20) includes one or more voltage sensors (190) configured to sense electric fields present in the underwater region (10) and provide information in the at least one signal indicative of the electric fields. Moreover, the sensor assembly (20) includes one or more hydrophones (200) operable to receive sonic energy generated in the underwater region (10) and to include corresponding information in the at least one sensor signal for communicating to the data processing arrangement (170, 510, 520).

20 Claims, 10 Drawing Sheets

(56) References Cited

U.S. PATENT DOCUMENTS

| | | |
|---|---|---|
| 7,149,150 B1 | 12/2006 | Scarzello et al. |
| 7,180,300 B2 | 2/2007 | Premerlani et al. |
| 2004/0108858 A1* | 6/2004 | Wilcoxon .................. 324/601 |
| 2005/0251340 A1 | 11/2005 | Tompkins |
| 2006/0238200 A1 | 10/2006 | Johnstad |
| 2007/0265782 A1 | 11/2007 | Kleinberg et al. |

* cited by examiner

UNDERWATER MEASUREMENT SYSTEM

CROSS REFERENCE TO RELATED APPLICATIONS

This application claims benefit under 35 U.S.C. §371 to international application No. PCT/NO2008/000420, filed on Nov. 24, 2008.

FIELD OF THE INVENTION

The present invention relates to underwater measurement systems. Moreover, the invention concerns methods of monitoring underwater regions using aforesaid underwater measurement systems. Furthermore, the present invention relates to sensor configurations for implementing such methods. Additionally, the invention concerns software products conveyable on data carriers and executable on computing hardware for implementing such methods.

BACKGROUND OF THE INVENTION

Underwater vessels such as submarines are well known. More recently, mini-submarines have been used to monitor fish stocks for farm cultured salmon and for inspecting submerged structures in deep-sea oil exploration. Monitoring and inspection is often performed using optical cameras for capturing images of underwater regions, as well as employing active sonar equipment for emitting sonic energy and receiving corresponding sonic reflections from submerged structures.

However, such methods of monitoring and inspection do not enable certain types of defects in structures to be detected, especially those of an electrical nature. More recently, there has been increased use of underwater cables for coupling power between electrical networks separated by regions of water, for example between southern Sweden and the Danish island of Sjælland, as well as across the English Channel between England and France. Moreover, underwater electrical cables are employed to provide power to submerged equipment during oil and gas exploration and extraction. Furthermore, telecommunications links including optical fibre waveguides often include electrical supply lines for providing power to erbium doped fibre optical amplifiers (EDFAs) for providing periodic regeneration of optical signals to compensate for optical attenuation occurring along the optical fibre waveguides.

Raising an underwater cable for repair is often an extremely expensive operation and there is a great need to be able to detect locations whereat submerged cables and electrical equipment are potentially defective or have developed faults. Optical inspection often provides an inadequate approach for identifying and localizing defects and faults.

In U.S. Pat. No. 7,116,108, which is based on published international PCT patent application no. WO 03/104844 (PCT/US03/18522), there is described a system for mapping electrical conductivity of the seafloor. The system incorporates several data logging units. Each unit is an assembly adapted for being deployed at a location on the seafloor for measuring horizontal electric and magnetic fields there. A vertically-orientated substantially rigid arm extends vertically from the unit assembly and includes a pair of vertically-displaced electrodes disposed on the arm to create a vertically-orientated dipole antenna. The electrodes of the arm are in electrical communication with an amplifier located within the assembly which generates an amplified signal which is then provided to a data logging processor also located within the assembly. The processor collects time series of amplified electric field and magnetic signals over a predetermined period of time.

Moreover, in a published U.S. Pat. No. 6,867,596, there is disclosed a method of detecting breakdowns in insulation and corresponding earth faults in a buried land cable; a test signal is applied to the cable, the signal being detected using a differential voltage probe placed in a conductive medium in near proximity to the cable. The differential voltage probe generates a received signal which is processed in a signal processing circuit operable to decompose components of the received signal corresponding to the test signal. The decomposed components are then subject to a phase comparison to determine a direction of current leakage associated with the earth fault.

Hostile aquatic environments can be subject to considerable water flows and other disturbances which render techniques hitherto employed unsuitable. There thus arises a challenging technical problem of detecting electrical faults in hostile aquatic environments.

A standard manner of testing for earth-connection faults in power distribution networks is to perform an insulation tests by "megging". When implementing "megging", a high potential signal is applied to a conductor surrounded by an insulator and a resistance of the insulator is measured in response to the signal being applied. Performing tests by "megging" is not feasible in a situation for detecting an earth fault on an electrically-floating secondary winding of an underwater transformer. There is no known contemporary method that is able to detect an earth fault associated with such a secondary winding of an underwater transformer without special instrumentation being built into the transformer for detecting occurrence of any such faults. This special instrumentation is susceptible to increasing installation complexity and cost and represents a sub-optimal solution. Transmission of a test signal into a transformer circuit is not satisfactory when the secondary side of the transformer is positioned in the sea bed and in operation.

SUMMARY OF THE INVENTION

An object of the present invention is to provide a system operable to detect electrical faults in an underwater region.

A further object of the invention is to provide a method of using the system for detecting electrical faults in the underwater region.

According to a first aspect of the invention, there is provided an underwater measurement system as claimed in appended claim 1: there is provided an underwater measurement system for monitoring an underwater region, the system including a sensor assembly operable to sense at least one physical variable in the region for generating at least one corresponding sensor signal, and a data processing arrangement for processing the at least one sensor signal to generate processed data for presentation and/or logging,
characterized in that
the sensor assembly includes one or more voltage sensors configured to sense electric fields present in the underwater region and provide information in the at least one signal indicative of the electric fields; and
the sensor assembly includes one or more hydrophones operable to receive sonic energy generated in the underwater region and to include corresponding information in the at least one sensor signal for communicating to the data processing arrangement.

The invention is of advantage in that the voltage sensors are capable of detecting electric fields generated by electrical faults in the underwater region, and the one or more hydrophones are able to detect corresponding acoustic signals corresponding to such faults, thereby enabling the faults to be more reliably and accurately identified.

Use of hydrophones is capable of providing confirmatory signals which enables one or more faults to be identified with greater certainty.

Optionally, in the underwater measurement system, the one or more hydrophones are configured as an array of hydrophones whose sonic sensing characteristic in operation has one or more preferred directions of sensitivity for enabling a direction of a source of sonic energy to be determined. Such preferred directions of sensitivity enables spurious noise arising from other directions to be selectively excluded from measurements using the system. More optionally, the one or more hydrophones constitute in operation a phased array of hydrophones whose polar sensitivity characteristics are electronically steerable from the data processing arrangement.

Optionally, in the underwater measurement system, the one or more voltage sensors are implemented as one or more pairs of electrodes operable to provide a differential voltage measurement in the region. Employing such a differential voltage measurement enables an electric field magnitude to be sensed, thereby removing any static voltage offsets which may potentially influence the one or more pairs of electrodes.

More optionally, the one or more pairs of electrodes are arranged to provide potential differential measurements in a plurality of mutually orthogonal directions. Such a measuring characteristic enables a spatial direction of an electric fault to be identified using the system.

More optionally, the one or more pairs of electrodes are fabricated from an inert material which is not chemically reactive with saline water. Such inertness of the electrodes assists to avoid generation of spurious signals as a result of chemical reactions of electrodes with fluid present in the underwater region.

Yet more optionally, the one or more pairs of electrodes are fabricated from carbon fibre or graphite. More optionally, the carbon fibre or graphite is porous to fluid present in the underwater region.

Optionally, the one or more pairs of electrodes are implemented such that their electrodes are provided with flow shields including access holes which enable the electrodes to electrically couple to the underwater region whilst reducing a rate of water flow over the electrodes when in operation.

Optionally, in the underwater measurement system, the data processing arrangement is operable to analyse the at least one sensor signal to determine a direction in which an electric field at a given signal frequency is orientated for assisting in determining a location of a source of the electric field within the underwater region. Such direction analysis enables a location of an electrical fault to be identified more rapidly and with greater certainty.

Optionally, in the underwater measurement system, the sensor assembly includes one or more chemical sensors operable to detect one or more chemical species or components present in the underwater region and to include corresponding information in the at least one sensor signal for communicating to the data processing arrangement, the information being indicative of the sensed one or more chemical species or components. Sensing chemical species present in the underwater region is susceptible to enabling certain types of underwater faults to be synergistically detected to a greater degree of certainty.

Optionally, in the underwater measurement system, the data processing arrangement is operable to compute one or more frequency spectra representative of the at least one sensor signal, and to display and/or log the one or more frequency spectra. More optionally, the data processing arrangement is operable to compare the one or more frequency spectra with one or more spectral templates for identifying one or more events occurring in the underwater region. Optionally, the data processing arrangement is operable to compare one or more harmonics of one or more signals generated by the one or more hydrophones against one or more harmonics of one or more signals generated by the one or more voltage sensors, for identifying differences therebetween for characterizing the underwater region. Optionally, the data processing arrangement is operable to compare the one or more sensor signals and/or the one or more frequency spectra with one of more threshold limits for identifying occurrence of one or more events in the underwater region.

Optionally, in the underwater measurement system, the sensor assembly includes an inertial sensor for determining an orientation and/or position of the sensor assembly, the inertial sensor being coupled in communication with the data processing arrangement. By sensing an inertial position of the sensor assembly and using sensor signals generated by the sensor assembly to manoeuvre the sensor assembly into a vicinity of an electrical fault, the spatial location of the fault is susceptible to being accurately determined from an eventual position of the probe adjacent to the fault.

Optionally, the underwater measurement system is adapted for executing passive detection of one or more electrical faults in the underwater region.

Optionally, when implementing the underwater measurement system, the sensor assembly is mounted on an underwater probe assembly coupled via a communication connection to computing hardware. More optionally, the communication connection is a flexible umbilical connection enabling the probe assembly to be manoeuvred within the underwater region.

Optionally, in the underwater measurement system, the data processing arrangement is distributed between the probe assembly and the computing hardware.

According to a second aspect of the invention, there is provided a method as claimed in appended claim 20: there is provided a method of monitoring an underwater region using an underwater measurement system, the system including a sensor assembly coupled in communication with a data processing arrangement, characterized in that the method includes:
(a) using one or more voltage sensors of the sensor assembly to sense electric fields present in the underwater region to generate at least one sensor signal including information indicative of the electric fields;
(b) using one or more hydrophones of the sensor assembly to receive sonic energy generated in the underwater region and to include corresponding information in the at least one sensor signal for communicating to the data processing arrangement; and
(c) processing the at least one sensor signal in the data processing arrangement to enable monitoring of the underwater region.

Optionally, when executing the method, the one or more hydrophones are configured as an array of hydrophones whose sonic sensing characteristic in operation has one or more preferred directions of sensitivity for enabling a direction of a source of sonic energy to be determined.

More optionally, the method includes steps of:
(a) using the one or more hydrophones as a phased array of hydrophones; and
(b) electronically steering polar sensitivity characteristics of the phased array from the data processing arrangement.

Optionally, when implementing the method, the one or more voltage sensors are implemented as one or more pairs of electrodes operable to provide a differential voltage measurement in the region. More optionally, the method includes a step of providing differential measurements in a plurality of mutually orthogonal directions using the one or more pairs of electrodes.

Optionally, the method includes a step of fabricating the one or more pairs of electrodes from an inert material which is not chemically reactive with saline water. More optionally, the one or more pairs of electrodes are fabricated from carbon fibre or graphite.

Optionally, when implementing the method, the one or more pairs of electrodes are implemented such that their electrodes are provided with flow shields including access holes which enable the electrodes to electrically couple to the underwater region whilst reducing a rate of water flow over the electrodes when in operation.

Optionally, the method includes a step of using the data processing arrangement to analyse the at least one sensor signal to determine a direction in which an electric field at a given signal frequency is orientated for assisting in determining a location of a source of the electric field within the underwater region.

Optionally, the method includes steps of:
(a) detecting using one or more chemical sensors included in the underwater measurement system one or more chemical species or components present in the underwater region; and
(b) including corresponding information in the at least one sensor signal for communicating to the data processing arrangement, the information being indicative of the sensed one or more chemical species or chemicals.

Optionally, the method includes steps of:
(a) using the data processing arrangement to compute one or more frequency spectra representative of the at least one sensor signal; and
(b) displaying and/or logging the one or more frequency spectra.

More optionally, the method includes a step of comparing in the data processing arrangement one or more harmonics of one or more signals generated by the one or more hydrophones against one or more harmonics of one or more signals generated by the one or more voltage sensors, for identifying differences therebetween for characterizing the underwater region.

More optionally, the includes a step of comparing the one or more signals generated by the one or more hydrophones against the one or more signals generated by the one or more voltage sensors, for monitoring slippage occurring in one or more rotating induction machines.

More optionally, the method includes a step of using the data processing arrangement to compare the one or more frequency spectra with one or more spectral templates for identifying one or more events occurring in the underwater region. More optionally, the method includes a step of comparing using the data processing arrangement the one or more sensor signals and/or the one or more frequency spectra with one of more threshold limits for identifying occurrence of one or more events in the underwater region.

Optionally, the method includes a step of using an inertial sensor of the sensor assembly for determining an orientation and/or position of the sensor assembly, the inertial sensor being coupled in communication with the data processing arrangement.

Optionally, the method is adapted for executing passive detection of one or more electrical faults in the underwater region.

According to a third aspect of the invention, there is provided a software product recorded on a data carrier, the software being executable on computing hardware for implementing a method pursuant to the second aspect of the invention.

According to a fourth aspect of the present invention, there is provided an underwater measurement system for monitoring an underwater region, the system including a sensor assembly operable to sense at least one physical variable in the region for generating at least one corresponding sensor signal, and a data processing arrangement for processing the at least one sensor signal to generate processed data for presentation and/or logging,
characterized in that
the sensor assembly includes one or more voltage sensors configured to sense electric fields present in the underwater region and provide information in the at least one signal indicative of the electric fields.

The invention is of advantage in that the voltage sensors are capable of detecting electric fields generated by electrical faults in the underwater region.

Optionally, in the underwater measurement system, the one or more pairs of electrodes are implemented such that their electrodes are provided with flow shields including access holes which enable the electrodes to electrically couple to the underwater region whilst reducing a rate of water flow over the electrodes when in operation. Use of the flow shields is capable of reducing spurious signals being generated at the one or more pairs of electrodes as a result of fluid present in the underwater region flowing over the electrodes, thereby improving quality of measurement by reducing spurious noise sources.

Optionally, for reducing external interference and thereby obtaining an enhanced quality of sensing using the underwater measurement system, the data processing arrangement is distributed between the probe and the computing hardware. Digitizing of signals and executing preliminary processing of the signals near the sensor assembly is capable of enhancing system robustness to interference and a risk of loss of information content in the one or more signals.

According to a fifth aspect of the invention, there is provided a method of monitoring an underwater region using an underwater measurement system, the system including a sensor assembly coupled in communication with a data processing arrangement,
characterized in that the method includes steps of:
(a) using one or more voltage sensors of the sensor assembly to sense electric fields present in the underwater region to generate at least one sensor signal including information indicative of the electric fields; and
(b) processing the at least one sensor signal in the data processing arrangement to enable monitoring of the underwater region.

Features of the invention are susceptible to being combined in any combination without departing from the scope of the invention as defined by the appended claims.

DESCRIPTION OF THE DIAGRAMS

Embodiments of the present invention will now be described, by way of example only, with reference to the following diagrams wherein.

Figure 1:
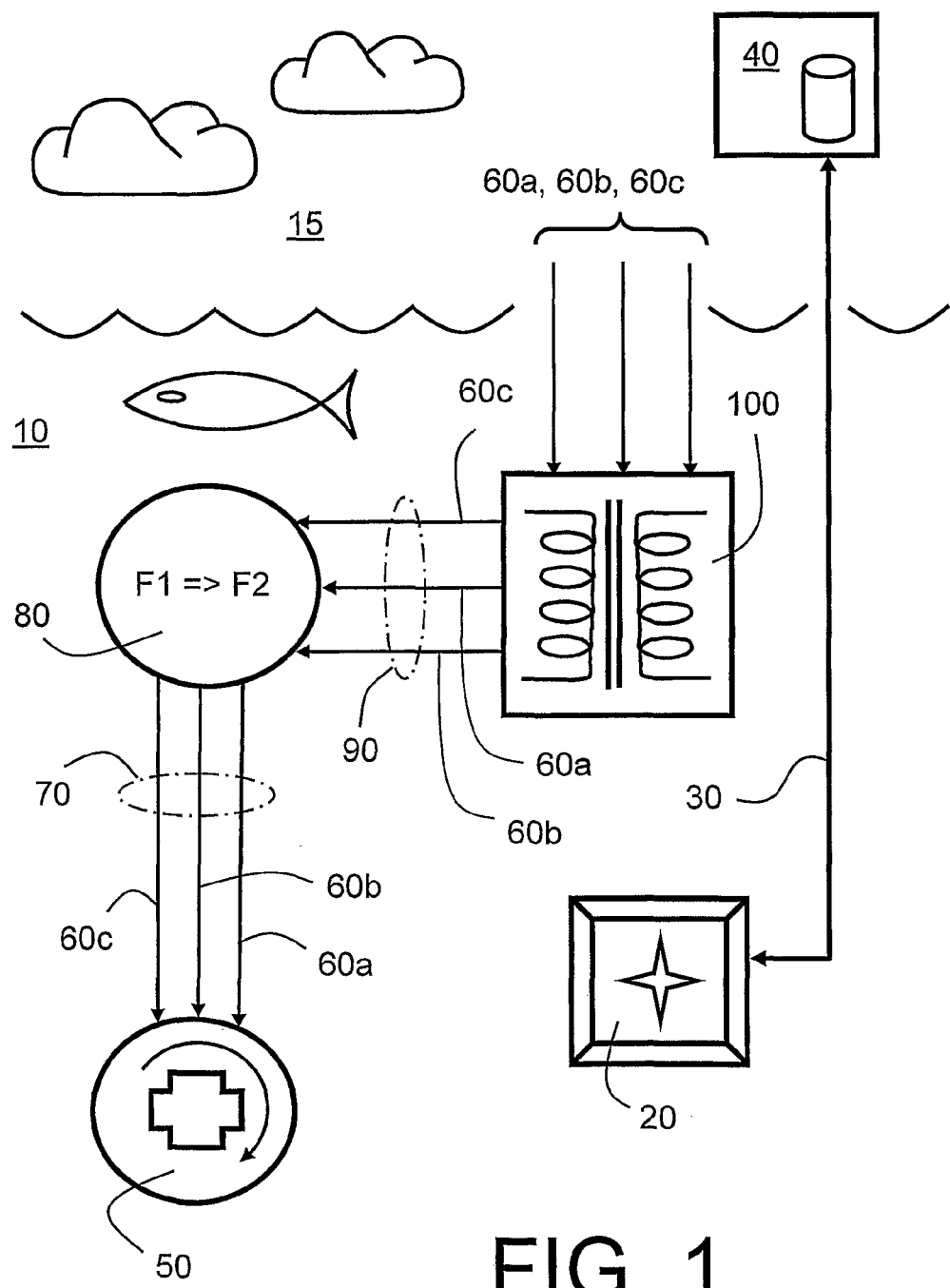
FIG. 1 is an illustration of an underwater measurement system pursuant to the present invention in an aquatic environment in a region of an underwater electrical installation.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF EMBODIMENTS OF THE INVENTION

In connection with operations implemented in a marine environment where electrical power supply is necessary, for example for operating electrical pumps and similar, a breakage or other fault in the electrical supply can result in a critical situation or damage in such operations. It is advantageous to have available apparatus for detecting and warning of potential faults at an early point in time for avoiding consequences of eventual faults and associated damage. In oil and gas production where high-potential power distribution is essential, in view of a magnitude of electrical power flows occurring, safety is of paramount importance. In situations in which equipment is installed on the sea bed, for example at depths of many kilometers, it is impossible to employ conventional surveillance technology to identify potential faults. Consequences of electrical current leakage are more severe than land-based systems, because electrical leakage in conducting underwater environments is susceptible to short circuiting whole electrical facilities.

In overview, the present invention is concerned with an underwater measurement system operable to perform passive measurements. Such operation is of benefit in that it is not necessary to employ a specially adapted test signal as required in known systems. The system employs an operatively underwater probe assembly comprising:

(a) an array of electrical sensors configured to measure electrical fields in a plurality of mutually orthogonal directions; and (b) an array of hydrophones for passively listening to sonar (acoustic) emissions, the hydrophones being orientated in a plurality of directions for determining a direction in which sonic (acoustic) energy is emitted.

Moreover, system includes a data processor arrangement coupled to the underwater probe assembly for receiving signals from the probe assembly, for processing the received signals, and presenting processed results derived from the received signals to one or more users of the system and/or to storing the processed results for subsequent later use. Beneficially, the system is optionally operable to synergistically associate information derived from the array of electrical sensors and the array of hydrophones for more precisely identifying a spatial location of an underwater fault and/or a nature of the underwater fault. On account of its passive nature, use of the system does not require operation of a structure being investigated having to be interrupted or disturbed, for example for receiving a test signal.

In other words, the present invention concerns a passive underwater electrical condition monitor for detecting, localising and characterising faults in submerged structures by sensing man-made electrical signals generated by such structures. By man-made electric signals, it is to be understood to mean electrical signals which are not of a natural source; in underwater environments, electrical signals are also present which derive from natural sources such as the Earth, its ocean and its atmosphere.

Referring to FIG. 1, there is shown an environment comprising an above-water region 15 and an underwater region 10. A system pursuant to the present invention includes an underwater probe assembly 20 operative in the region 10 and coupled via one or more flexible connections 30 to a data processing arrangement 40 operative in the region 15. There is shown a submerged electric motor 50, for example a mud circulating pump of an oil or gas production facility. The motor 50 is a 3-phase induction motor having three electrical phases denoted by 60a, 60b, 60c. Moreover, the three phases 60a, 60b, 60c are coupled via a screened cable housing 70 to a frequency converter 80 so that:

(a) the motor 50 is provided with its three-phase supply at a frequency of F2; and (b) the frequency converter 80 is provided with a three-phase supply at a frequency of F1 from a secondary winding arrangement of a transformer 100 provided to the converter 80 in a screened cable housing 90.

A primary winding arrangement of the transformer 100 is coupled to a three-phase source of power situated in the region 15.

In operation, when the motor 50 is coupled in its three-phase supply 60a, 60b, 60c and in operation, the underwater probe assembly 20 is moved into water in close proximity of an outside of the motor 50, the housings 70, 90, the frequency converter 80 and the transformer 100 to sense electric fields present in the water and sonic (acoustic) energy conveyed through the water and generate corresponding electrical and sonic measurement signals E, S respectively. The underwater probe assembly 20 in cooperation with its data processing arrangement 40 is operable to continuously process the electrical and sonic measurement signals E, S in real-time to generate processed data for presentation and/or for storage in data memory to generate a log. Such continuous processing includes for example:

(a) determining a frequency spectrum H of one or more of the measurement signals E, S;

(b) a correlation of one or more of the frequency spectra H of one or more of the electrical measurement signals E with a frequency spectrum template $T_E$ of example measurement signals corresponding to various categories of faults;

(c) a correlation of one or more of the frequency spectra H of the one or more sonic measurement signals S with a frequency spectrum template $T_S$ of example measurement signals corresponding to various categories of faults; and/or (d) a correlation of both one or more of the frequency spectra H of the electrical measurement signals E and one or more of the frequency spectra H of the sonic measurement signals S to identify synergistically certain categories of faults, for example with reference to one or more correlation templates sonic-electrical $T_{ES}$ corresponding to various categories of faults.

In this case, "correlation" is to be construed broadly to mean any comparison techniques, for example mathematical correlation as well as other approaches to comparing signals such as neural networks and rule-base algorithms.

Figure 2:
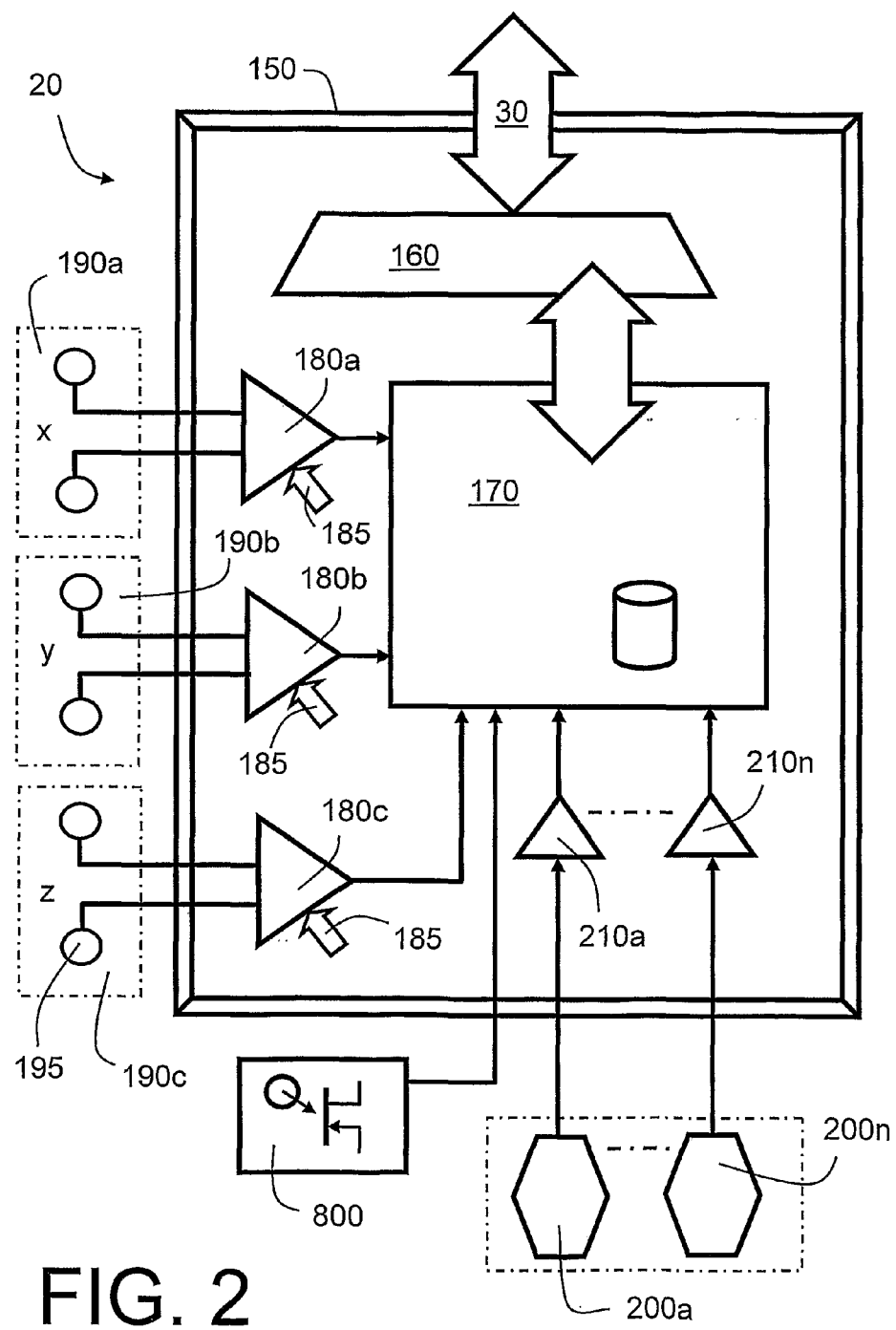
FIG. 2 is a schematic illustration of an underwater probe assembly of the system shown in FIG. 1.

Referring next to FIG. 2, there is shown a schematic illustration of the under probe assembly indicated generally by 20. The probe assembly 20 includes a housing 150 onto which an electrical sensor arrangement 190a, 190b, 190c is mounted. Moreover, there is also mounted to the housing 150 a hydrophone sensor arrangement 200a to 200n. The housing 150 includes an interfacing unit 160 for receiving control signals and power from the processing arrangement 40 in the region 15, and for sending measurement signals from the probe assembly 20 to the processing arrangement 40. The housing 150 further includes a digital signal processor (DSP) 170 including processing hardware and local data memory. The electrical sensor arrangement 190a, 190b, 190c is coupled via low-noise amplifiers 180a, 180b, 180c respectively to signal sampling inputs of the digital signal processor 170; the low-noise amplifiers 180a, 180b, 180c provide signal amplification, for example in a range of 60 dB to 90 dB, which is individually adjustable under control, as denoted by 185, from the digital signal processor 170. Moreover, the hydrophone sensor arrangement 200a to 200n is coupled via amplifiers 210a to 210n respectively to signal sampling inputs of the digital signal processor 170. The digital signal processor 170 is coupled to provide data to the interfacing unit 160 which is, in turn, coupled to the one or more flexible connections 30, for example implemented as an elongate armoured umbilical flexible cable assembly.

In operation, sonic and electrical signals detected by the electrical sensor arrangement 190a, 190b, 190c and the hydrophone sensor arrangement 200a to 200n are amplified, converted from analogue to digital form and then streamed as corresponding data via the interfacing unit 160 via the one or more flexible connections 30. The interface unit 160 is beneficially operable to receive a 230 volt a.c. supply for powering the probe assembly 20. Signals are communicated between the probe assembly 20 and the data processing arrangement 40 via a twisted cable pair included in the one or more flexible connections 30; the twisted cable conveying bi-directional Ethernet-format data flow.

Figure 5:
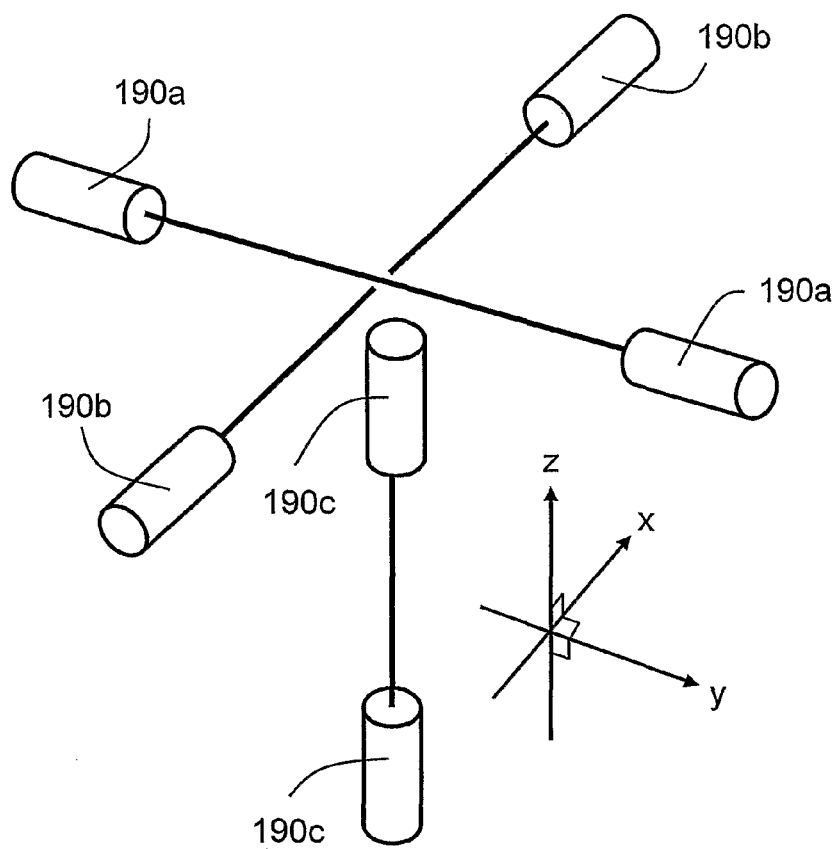
FIG. 5 is an electrical sensor arrangement employed in the probe assembly in FIGS. 3 and 4.

The electrical sensor arrangement 190a, 190b, 190c is operable to be able to detect potential gradients, namely electrical fields, corresponding to an order of magnitude of nV/meter or greater. In order to measure such potential gradients, the arrangement 190a, 190b, 190c employs a differential measurement technique in x, y, z orthogonal axes as illustrated in FIG. 5. The arrangement 190a, 190b, 190c includes three pairs of electrodes 195 arranged along the axes x, y, z; namely a first pair 190a of electrodes 195 orientated along the y axis, a second pair 190b of electrodes 195 orientated along the x-axis, and a third pair 190c of electrodes 190c orientated along the z-axis. The electrodes 195 are themselves of very special construction which will be elucidated in more detail later with reference to FIG. 6.

The hydrophone sensor arrangement 200a to 200n includes hydrophones including piezo-electric, electromagnetic and/or condenser transducers. Hydrophones of the hydrophone sensor arrangement 200a to 200n are disposed in various orientations on the probe assembly 20 so as to provide mutually different polar responses to received sonar energy at the probe assembly 20. For example, the hydrophone sensor arrangement 200a to 200b in cooperation with the digital signal processor 170 is susceptible to function as a steered sonar array providing a polar sensitivity characteristic which is directionally steerable by selectively phase shifting and amplifying signals provided from the hydrophones.

Figure 3:
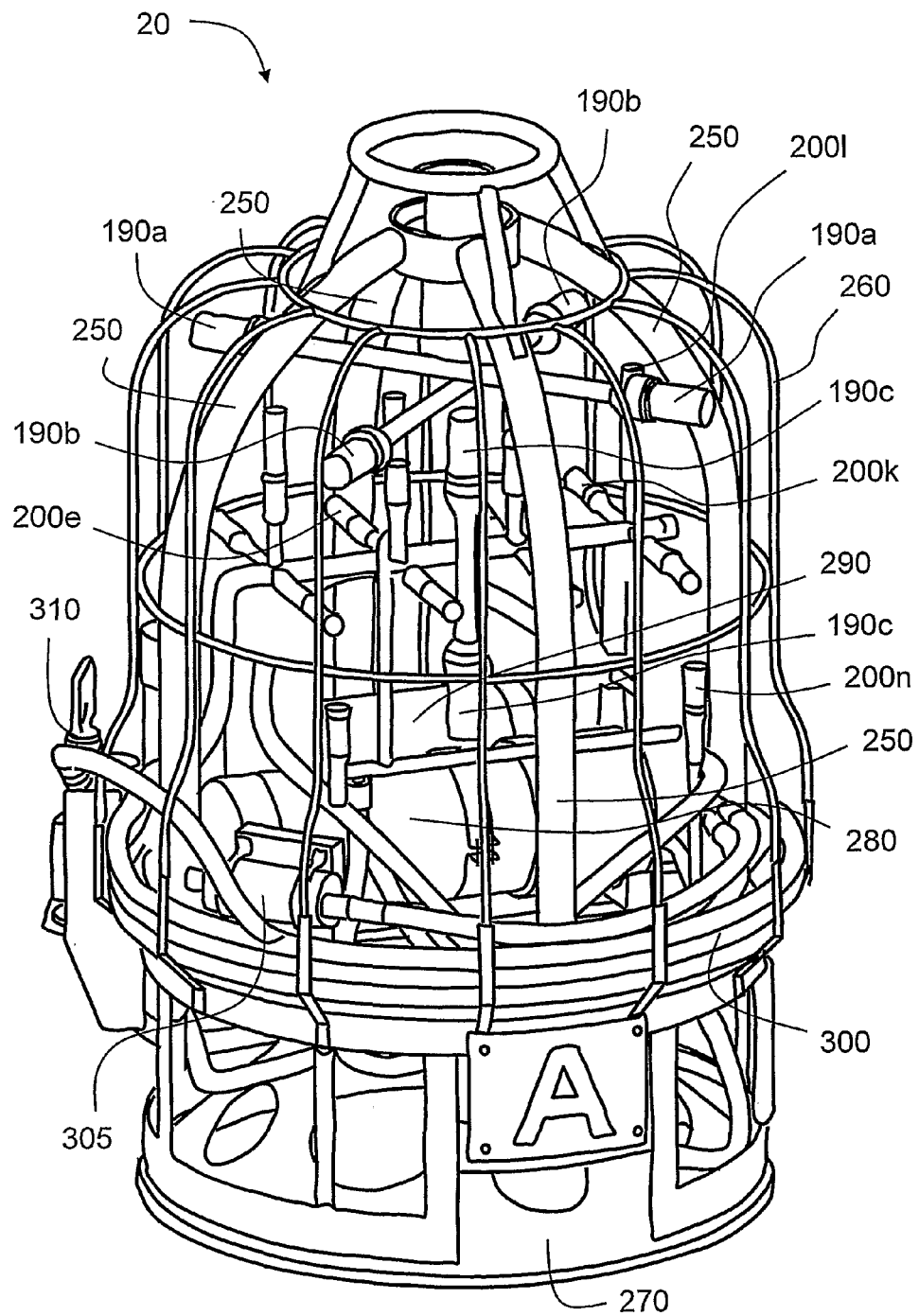
FIGS. 3 and 4 are illustrations of an implementation of the probe assembly of FIG. 2.
Figure 4:
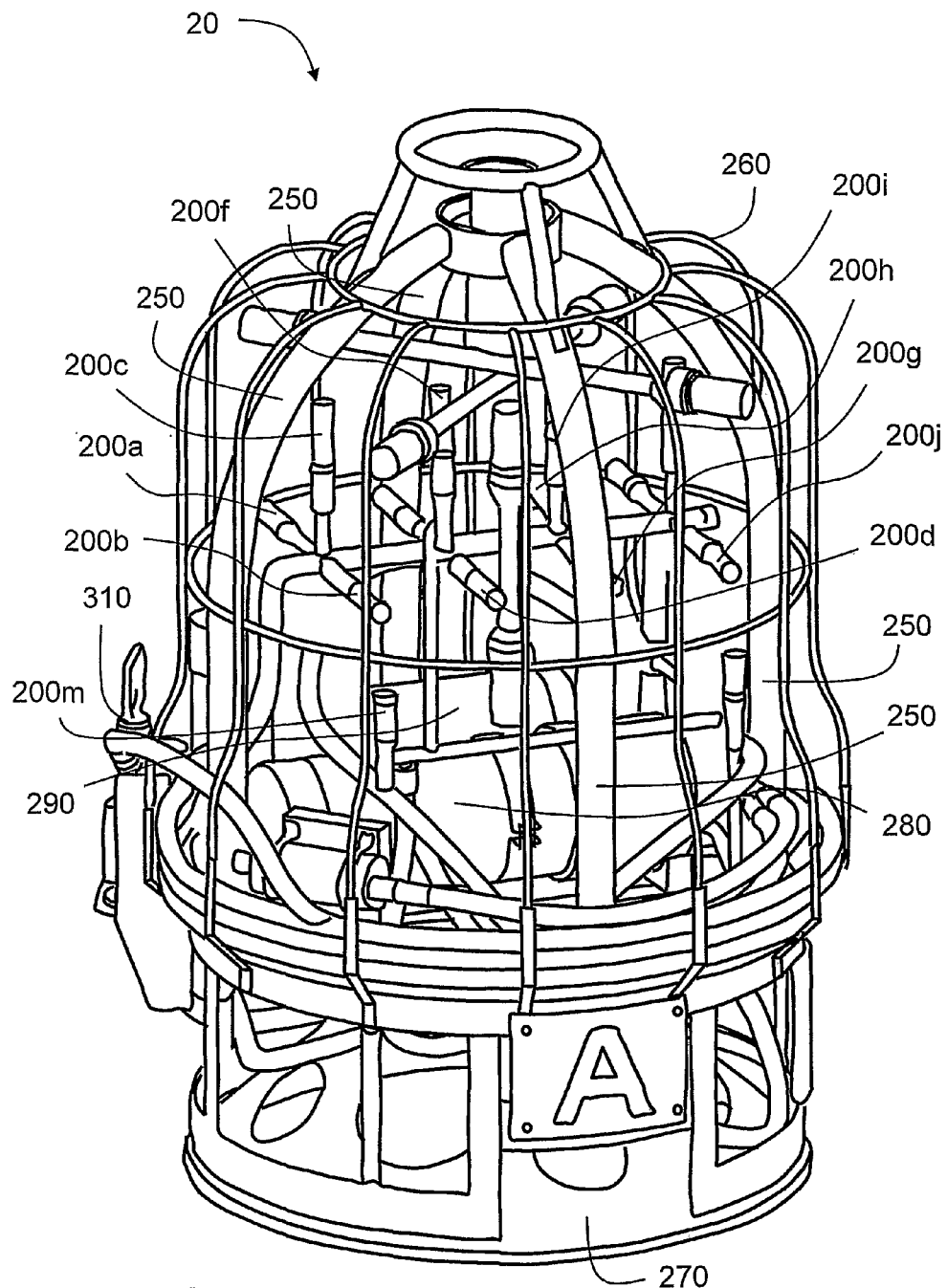

Referring to FIGS. 3 and 4 in combination, there is shown an implementation of the probe assembly 20 in more detail. The probe assembly 20 includes a structural frame comprising four robust elongate tubular components 250 supporting a protecting frame of more slender elongate tubular components 260. The tubular components 250, 260 extend from an upper portion of the probe assembly 20, whereat they are joined to an upper ring, to a base 270 of the probe assembly 20. The probe assembly 20 is mechanically lowered into water for performing a measurement by coupling a winch substantially in a region of the upper ring. The base 270 includes a frusto-conical web so that delicate portions of the probe assembly 20 are mechanically shielded from damage in an event that probe assembly 20 contacts onto the sea bed. Moreover, the tubular components 250, 260 define an inner volume to the probe assembly 20 including a underwater cable 300 terminated at one end in a first underwater connector 310, and at another end to a second underwater connector 305 associated with first and second watertight tubular housings 280, 290 for housing the amplifiers 180, 210, the digital signal processor 170 and the interface unit 160. It will be seen that the hydrophone assembly 200a to 200j is disposed in sideways and upwardly directed groups of hydrophones. The probe assembly 20 includes tubular interconnecting watertight ducts to convey signals from the hydrophones and the electrodes pairs 190a, 190b, 190c to the housings 280, 290.

Figure 6:
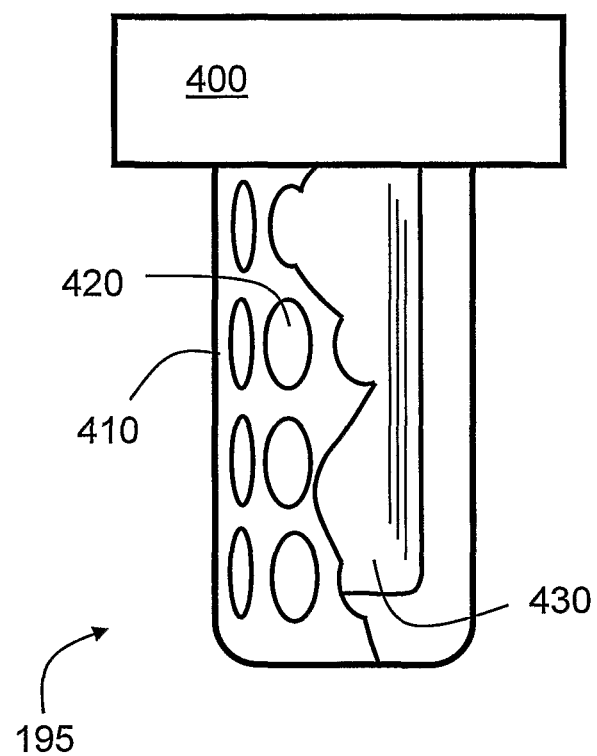
FIG. 6 is an illustration in part cut-away view of an electrical sensor of the electrical sensor arrangement of FIG. 5.

Referring to FIG. 6, a physical construction of one of the electrodes 195 is illustrated. It is known when making potential measurements in water including conductive salts comprising cations and anions that electro-potentials with electrodes are susceptible to arising. These electro-potentials arise close to the surface of an electrode for one or more of the following reasons:

(a) a higher electron density existing in the material of the electrode in comparison to salt water surrounding the electrode causes a diffusion of electrons from the surface of the electrode a few nanometers into the salt water by way of electron position uncertainty and associated electron tunnelling pursuant to Heisenberg's uncertainty principle, thereby causing a capacitor-like effect to be created with its associated energy barrier; and (b) a local chemical reaction occurs at the electrode with cations and anions present in the salt water creating an energy barrier.

It has in some circumstances been customary to employ stainless steel electrodes to cope with reactions in (b) but instabilities in contact potentials of stainless steel to salt water are considerable making these stainless steel electrodes noisy and unstable. Alternatively, electrodes fabricated from silver, or a combination of silver and silver chloride, have been used in water meters and similar instruments for measuring flow rates of non-saline water. These silver electrodes would tend to be corroded away rapidly in hostile saline environments in which the probe assembly 20 is designed to operate. Moreover, for both stainless steel and silver electrodes, temporal fluctuations in concentrations of various cations and anions in saline solution are susceptible to influencing signals generated from these electrodes which are potentially at least partially in a frequency range of interest. The temporal fluctuations are thus manifest in increased background noise generated by the electrode.

When implementing the probe assembly 20, it has been found highly advantages to implement the electrodes 195 in a manner as illustrated in FIG. 6. The electrode 195 includes an electrode component 430 implemented using substantially inert carbon fibre material, alternatively graphite material; the electrode component 430 is coupled to an input of an amplifier. The carbon fibre material is optionally porous. Alternatively, graphite material does not react with salt water and has a lower electron density in comparison to materials such as silver and stainless steel. Moreover, the carbon fibre material, alternatively the graphite material, is beneficially of an open porous nature so that salt water penetrates into the carbon fibre material, alternatively graphite material, for provided an enhanced connection thereto, thereby resisting a tendency of the electrode to become at least partially insulated from sea water by deposits formed on a surface of the carbon fibre material or graphite material. Furthermore, the electrode 195 includes a flow guard 410 including one or more apertures 420 therein for shielding the electrode component 430 from rapid temporary fluctuations in salt cation and anion concentration as salt water flows past the probe assembly 20 when in operation. Optionally, there are included a plurality of apertures 420 in the flow guard 410. The electrode component 430 is electrically connected to its associated low-noise amplifier 180. Moreover, the flow guard 410 is implemented in metal or an insulating polymer material. The electrode component 430 is supported by a mechanical base 400 which enables the electrode 195 to be mounted to the probe assembly 20 as illustrated in FIGS. 3 and 4.

The low-noise amplifiers 180 are subject to flicker noise at frequencies substantially below 100 Hz, shot noise at frequencies up to several kHz, and wide-band thermal noise over a wide frequency spectrum. In view of the amplifiers 180 being required to amplify signals generated at the electrodes 195 in an order of nanovolts (nV), the amplifiers 180 are beneficially low-noise FET, bi-polar or thermionic vacuum tube amplifiers configured to exhibit low intrinsic noise over frequency ranges of interest for operation of the probe assembly 20. Similar considerations pertain also to the amplifiers 210 associated with the hydrophone assembly 200.

Figure 7:
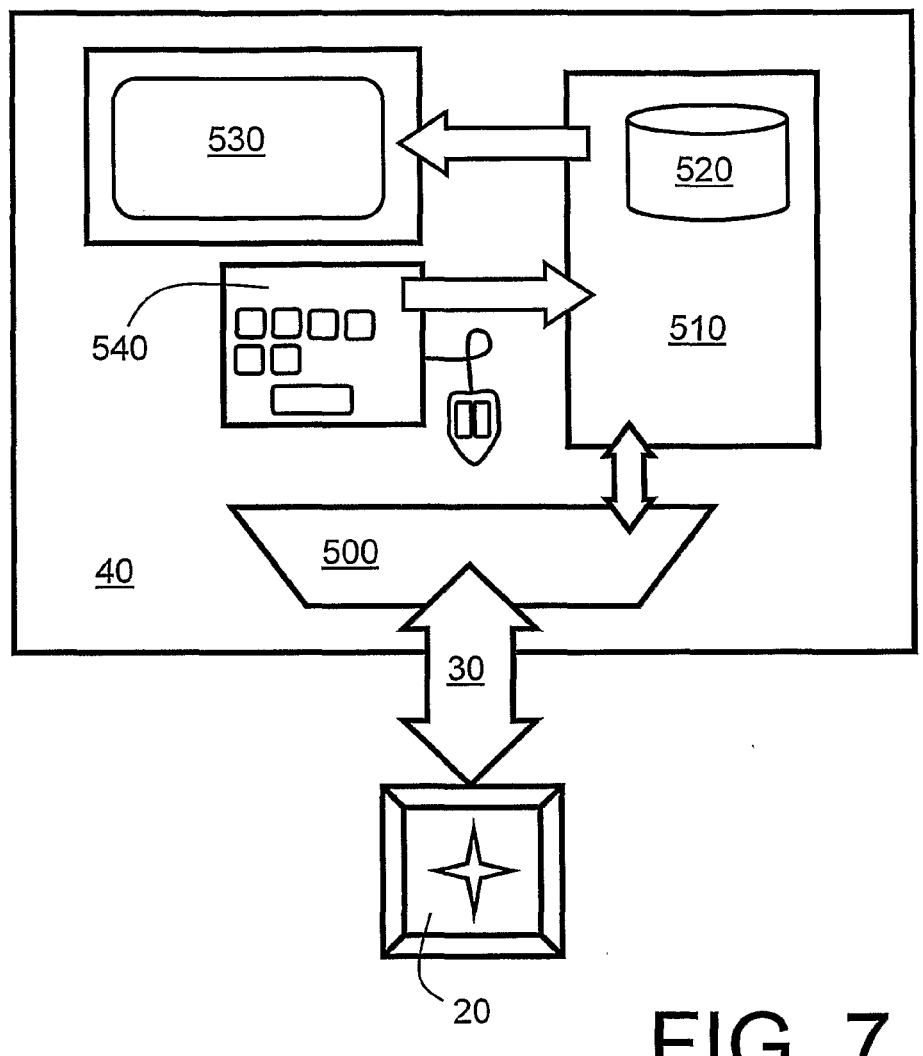
FIG. 7 is a schematic illustration of a data processing arrangement for use with the underwater probe assembly of FIG. 2.

The data processing arrangement 40 will now be described in more detail with reference to FIG. 7. The data processing arrangement 40 is, for example, on an aquatic vessel such as a ship, an oil rig, a gas rig, but is also susceptible to being supported from a submarine manoeuvring in shallower water than that of the probe assembly 20. For communicating via the one or more flexible connections 30 with the interface unit 160 of the probe assembly 20, the data processing arrangement 40 includes an interface unit 500, for example operable to support bi-directional Ethernet communication. The interface unit 500 is coupled within the processing arrangement 40 to a computer 510 including data storage 520, for example magnetic disk drives and/or solid state memory. The computer 510 is coupled to a display device 530, for example one or more LCD flat-screen displays for presenting results to one or more users. Moreover, a data entry device 540, for example a keyboard with its associated mouse or tracker ball, is coupled to the computer 510.

The computer 510 is operable to execute one or more software products conveyed thereto on a data carrier, for example on an optical disc, on a signal such as an Internet signal, in a solid state memory device. Moreover, the computer 510 is capable of downloading and/or configuring one or more software products executing in operation on the digital signal processor 170 of the probe assembly 20. Whereas the digital signal processor 170 of the probe 20 is primarily concerned with signal acquisition and formatting the acquired signals, for example optionally applying data compression such as a parametric representation of acquired signals for transmission via the one or more flexible connections 30, the computer 510 is primarily concerned with interpreting the signals communicated from the probe assembly 20, for example by rule-based comparison, correlation or similar, and presenting corresponding results on the display device 530.

Figure 8:
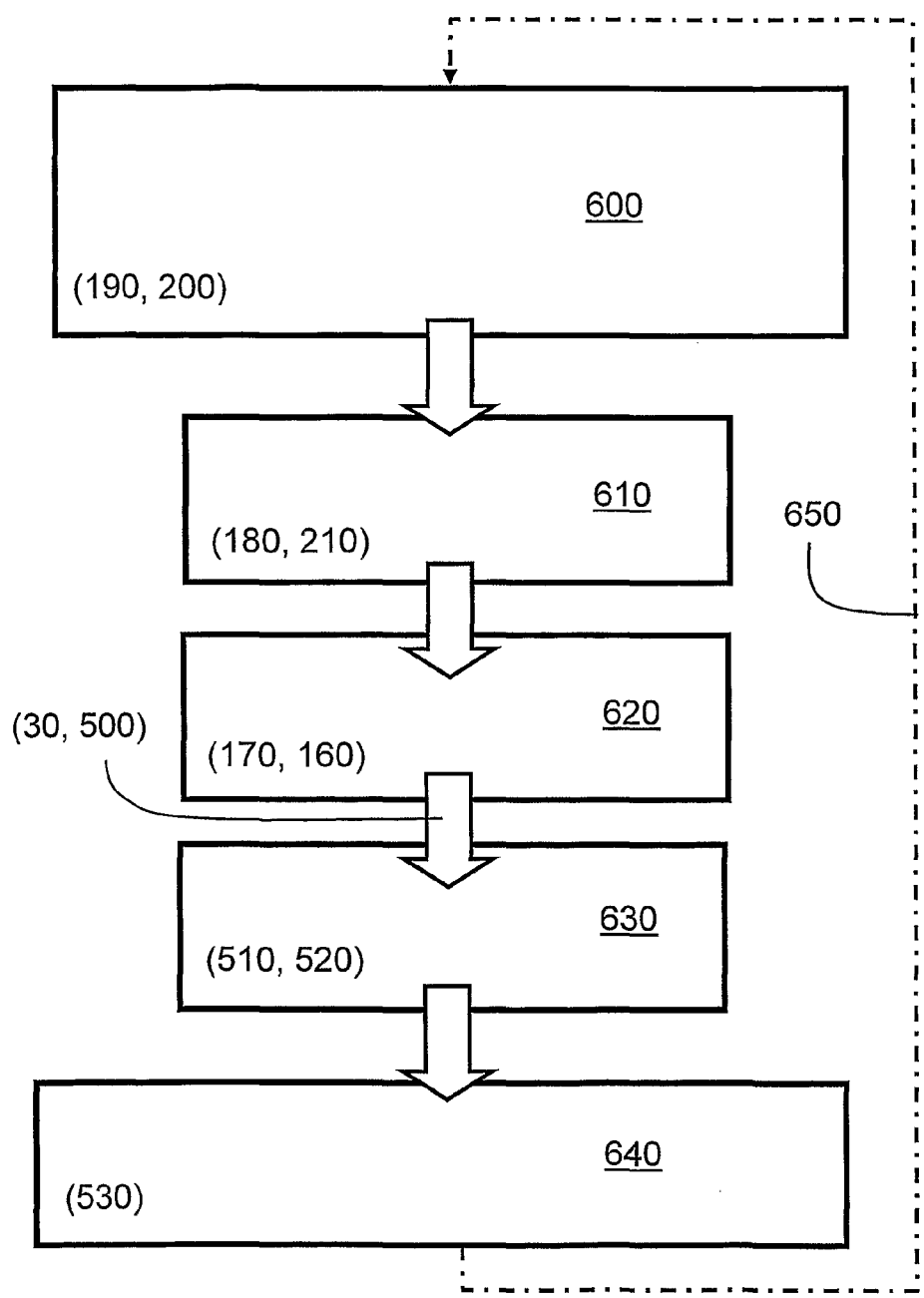
FIG. 8 is a flow chart representing data processing operations performed in the underwater measurement system.

In FIG. 8, there is shown a flow diagram of steps continuously executed by the probe assembly 20 in cooperation with its data processing arrangement 40. The flow diagram represents steps of a method which is beneficially repetitively and continuously implemented.

A first step 600 of the method concerns detecting signals at the pairs of electrodes 190 and/or at the hydrophone assembly 200.

A second step 610 of the method concerns amplifying in the amplifiers 180, 210 the signals from the first step to generate corresponding amplified signals; the amplification is optionally one or more:
(a) variable in gain under software control from the digital signal processor 170 and/or the computer 510;
(b) dynamically variable in gain in response to sensed signal amplitude to provide an enhanced sensing dynamic range; and
(c) subject to frequency filtering within the amplifiers 180, 210 to remove noise at an early stage as possible during signal handling; optionally such filtering is dynamically alterable under software control.

A third step 620 of the method concerns signal processing amplified and digitized signals, namely subject to analogue-to-digital conversion, by one or more of:
(i) processing signals S from the hydrophone assembly 200 to provide a steered beam characteristic for providing the hydrophone assembly 200 with a specific directional sensitivity characteristic; signals S from one or more hydrophones of the hydrophone assembly 200 are individually subject to gain adjustment and relative phase shift to generate intermediate signals; the intermediate signals are then summed to generate a signal for conveying to the computer 510; the individual gain adjustments and relative phase shifts are used to steer the directional characteristic in which preferential sensitivity is to be provided by the hydrophone assembly 200;
(ii) computing a difference between signals provided from the electrode pairs 190a, 190b, 190c to compute difference signals indicative of electric field gradient experienced by the electrode pairs 190a, 190b, 190c;
(iii) filtering of signals to remove noise components therefrom which do not contribute to detection of faults or similar conditions to be monitored;
(iv) applying signal analysis to generate frequency spectra of signals and their relative phase relationships to generate parametric representations whose parameters are then communicated to the computer 510 via the interface units 160, 500 and the one or more flexible connections 30; and
(v) applying data compression of signals for communicating corresponding compressed signals via the interface units 160, 500 and the one or more flexible connections 30.

The third step includes also transmitting output data from the probe assembly 20 via the interface units 160, 500 to the computer 510.

A fourth step 630 is concerning with processing digitized signals at the computer 500 and, if required, generating a log of the digitized signals. Such processing includes one or more of:

(a) frequency spectral analysis;
(b) correlation and analogous comparison of signal frequency spectra with template frequency spectra for identifying specific types of faults;
(c) comparing the digitalized signals, their frequency spectra, or a correlation of their frequency spectra with one or more threshold limits for determining whether or not a specific type of fault is identified by the probe.

The fourth step also includes receiving control instructions from the one or more users regarding one or more of:

(a) steering the directional sensitivity for the hydrophones in a preferred direction;
(b) selecting a preferred spectral template for which specific type of fault is to be detected;
(c) resolving signals from the electrode pairs 190a, 190b, 190c at any particular frequencies to determine a direction in which the electric field is orientated in respect of the probe 20;
(d) adjusting a threshold limit for detecting one or more types of faults;
(e) applying a specific type of filter profile to one or more signals provided from the probe assembly 20; and
(f) comparing measurement signals from the probe assembly 20 obtained in real-time with a previous record of corresponding signals for detecting any changes that have occurred, for example corresponding to a gradually developing fault.

A fifth step 640 of the method concerns presenting computed results to the one or more users. Such presentation is beneficially provided via a graphical software interface provided on the display device 640.

The method is susceptible to being repeated continuously in real-time as denoted by a dotted arrow 650. Moreover, iteration back and forth between the fourth and fifth steps 630, 640 is also feasible as elucidated earlier. Furthermore, the computer 500 is synergistically susceptible to processing signals from both the hydrophone assembly 200 and the electrode pairs 190 and identifying faults giving rise to both sonar (acoustic) signals as well as corresponding electrical fields; for example a region where water has ingressed into an underwater power cable whereat electrolytic action generates bubbles from the cable as well as conducting current and thereby giving rise to weak electric fields in water. When motors are included in underwater assemblies, the hydrophone assembly 200 can be used to detect imbalance in the motor and/or signs of early failure of motor bearings on account acoustic harmonics of a frequency at which the motor is revolving.

The fourth step 630 is susceptible to allowing key harmonic signatures to be identified. For example, synchronous inductive rotating machines deployed in underwater environments are manufactured so that their motor rotors are balanced for reducing vibration, for example to reduce wear and stress on rotor mounting bearings. Such rotors are subject to a rotating magnetic field at a frequency $F_1$ of substantially 50 Hz mains frequency, or at some other frequency when variable frequency electronic drives are employed. Moreover, such motor rotors rotate at a frequency $F_2$ under no-load conditions which is normally substantially equal to the frequency $F_1$ or a sub-harmonic thereof, depending upon a number of poles included in the motors. However, when the moor rotors are subjected to a mechanical load, they rotate at a frequency $F_2'$ which is less than the frequency $F_2$ on account of slippage occurring in the motors. Equations 1 and 2 (Eqs. 1 and 2) describes a relationship of these frequencies $F_1$, $F_2$ and $F_2'$ to a first approximation:

$$F_2 = \frac{nF_1}{m} \quad \text{Eq. 1}$$

$$F_2' = (1 - kT)F_2 \quad \text{Eq. 2}$$

wherein
$F_1$=rotating magnetic field frequency;
$F_2$=no-load rotating frequency of rotor;
$F_2'$=loaded rotating frequency of rotor;
n=harmonic number when m=1;
m=sub-harmonic number when n=1;
T=applied torque to rotor;
k=load characteristic of the rotor's motor.

For describing more heavily loaded conditions where the torque T is considerable, the term kT in equation is substituted with kg(T), wherein g is a polynomial function. In a situation where a variable frequency drive is employed, for example generated using high-power solid-state electronic switching components, the motors are provided with electrical drive signals which have trace higher-frequency electrical harmonic components.

When the probe assembly 20 is employed to investigate a submerged induction rotating machine subject to variable slippage due a varying torque load being applied thereto, the hydrophone sensor arrangement 200a and 200n is operable to generate signals which include signal components which are at different frequencies in comparison to signal components present in signals generated by the electrical sensor arrangement 190a, 190b, 190c. As aforementioned, it is found in practice that certain harmonic or sub-harmonic components are especially representative of mechanical or electrical processes occurring in such rotating machines.

Figure 9:
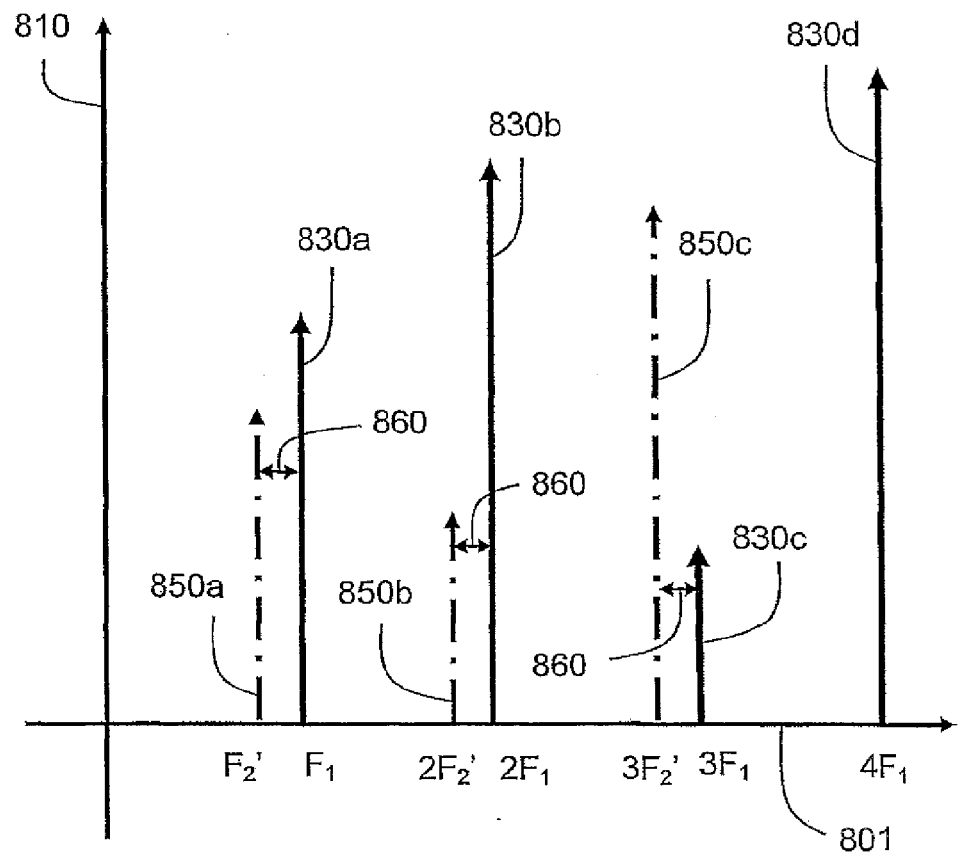
FIG. 9 is a graph illustrating harmonic components of signals obtained using the underwater measurement system of FIG. 1.

Referring to FIG. 9, there is shown a graph included an abscissa axis 801 denoting increasing frequency from left to right, and an ordinate axis 810 denoting increasing harmonic component amplitude from bottom to top. Components 830a, 830b, 830c, 830d correspond to fundamental (first harmonic), second harmonic, third harmonic and fourth harmonic of an electrical drive signal to a rotating machine as detected using the electrical sensor arrangement 190a, 190b, 190c. Moreover, components 850a, 850b and 850c correspond to fundamental (first harmonic), second harmonic and third harmonic of an acoustic signal generated by the rotating machine as detected using the hydrophone sensor arrangement 200a to 200n. As denoted by arrows 860, a frequency difference between the harmonics is a function of slippage occurring in the rotating machine and hence a mechanical load applied thereto as shown in FIG. 10.

Figure 10:
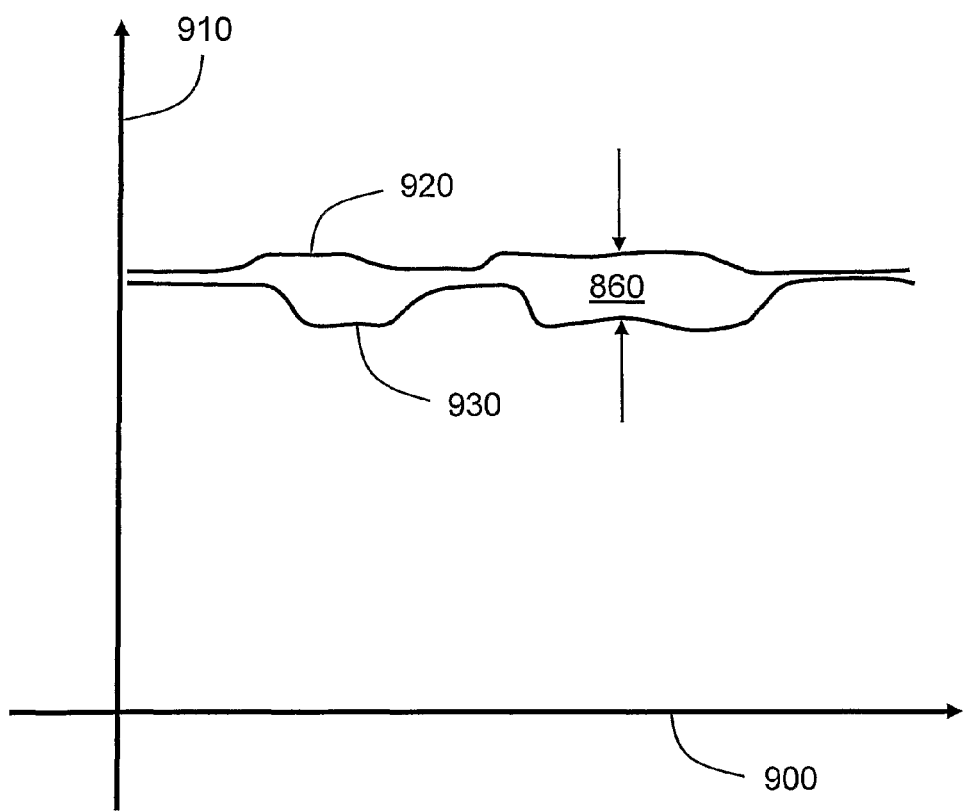
FIG. 10 is an illustration of a temporal log of signals generated by the underwater measuring system of FIG. 1.

In FIG. 10, an abscissa axis 900 denotes elapsed time from left to right, and an ordinate axis 910 denotes increasing frequency from bottom to top. A curve 920 corresponds to a frequency-normalized electrical signal harmonic component obtained using the electrical sensor arrangement 190a, 190b, 190c. Moreover, a curve 930 corresponds to a frequency-normalized acoustic signal obtained using the hydrophone sensor arrangement 200a to 200n. The curves 920, 930 diverge in frequency as the rotating machine is mechanically loaded in a manner as described in aforesaid Equations 1 and 2 (Eqs. 1 and 2). The probe assembly 20 thereby allows operating characteristics of rotating machines deployed in underwater environments to be monitored. Optionally, for diagnosing potential faults with such rotating machines, relative amplitudes of harmonic components can be monitored in response to various loads being applied to the rotating machine. By employing such an approach, it is possible to detect at an early stage damaged or worn motor bearings, faults in pumps coupled to such rotating machines, and so forth. Contemporary deep-sea oil exploration and oil recovery at many hundred meters water depth employs apparatus deployed on the seabed for performing oil and gas pumping, mud pumping, water pumping and so forth; in an event of faults in such apparatus occurring, it is extremely expensive to perform maintenance and bring the apparatus to sea surface, such that the present invention is susceptible to being used for diagnostic purposes for identifying problems and, in certain situation, avoiding a need to unnecessarily replace and/or repair such apparatus.

The present invention is not limited to performing measurements on rotating machines. For example, the probe assembly 20 is susceptible to being used for monitoring operation of electro-mechanical actuators, electro-mechanical valves, underwater cables, to mention a few examples. The probe assembly 20 is also susceptible to being used to detect leaks in underwater pipes, for example underwater oil pipelines.

Optionally, the probe assembly 20 includes additional instrumentation, for example one or more of:
(a) a magnetic compass for detecting an orientation of the probe assembly 20 in respect of the Earth's magnetic poles;
(b) an inertial navigation system including gyroscopes and accelerometers for monitoring an orientation and position of the probe assembly 20 in the underwater region 10; optionally robust silicon micromachined precision accelerometers and optical fibre gyroscopes are employed in such an inertial navigation system; the position and orientation of the probe assembly 20 is then beneficially displayable on the display device 530 to the one or more users;
(c) a depth gauge for determining a depth of the probe assembly 20 in the underwater region 10;
(d) a temperature sensor for measuring a temperature of water near the probe assembly 20, for example certain types of electrical fault such as partial short circuits are susceptible to causing localized heating effects; and
(e) one or more digital cameras for viewing a vicinity in which the probe assembly 20 is operating; optionally, the one or more digital cameras include at least one infra-red sensitive camera. Optionally, the one or more cameras are steerable from the computer 500.

Modifications to embodiments of the invention described in the foregoing are possible without departing from the scope of the invention as defined by the accompanying claims.

Optionally, the underwater probe assembly 20 also includes one or more chemical sensors 800 as illustrated in FIG. 2 for sensing one or more chemicals present in the underwater region 10. The one or more chemical sensors 800 are beneficially based on one or more of:
(a) one or more Chem-FET sensors employing one or more field effect transistor (FET) devices whose respective one or more gate electrodes have been doped or otherwise adapted so that the transistor devices are operable to exhibit preferential sensitivity to certain types of ion present in solution in the underwater region 10;
(b) one or more organic chemical sensors including enzymes or polypeptides labelled with fluorescent molecules whose optical response changes in response to the enzymes or polypeptides binding to complementary molecules present in the underwater region 10, for example debris from insulation polymers degenerated by underwater electrical discharge action; such techniques optionally include ejecting a fluorescent tracer material into a region around the underwater probe assembly 20 and then using optical radiation to remotely interrogate the region of water to monitor fluorescence from the tracer material ejected into the region;
(c) one or more chemical sensors based upon use of one or more selective membranes, for example one or more lipid membranes; diffusion of chemical substances present in a region of water around the probe assembly 20 through such a membrane into an interrogation cavity occurs, such that chemical substances successfully diffusing into the interrogation cavity are detected by optical spectral sensing methods; beneficially, the one or more membranes are periodically or continuously mechanically advanced to expose fresh membrane material to prevent the one or more membranes becoming blocked or deactivated by other materials present in a region surrounding the probe assembly 20; and
(d) one or more chemical sensors based upon illuminating a region in proximity of the underwater probe assembly 20 and measuring an optical spectral response of the region.

Signals generated in operation by the one or more chemical sensors 800 are indicative of chemical species and/or organic molecules present in the underwater region 10; these signals are coupled to the digital signal processor 170. The digital signal processor 170 is operable to process these signals to generate intermediate chemical sensor data; the intermediate chemical sensor data is subsequently communicated via the one or more flexible connections 30 to the processing arrangement 40. The processing arrangement 40 is operable to interpret the intermediate chemical sensor data to assist with identifying a nature of a potential fault present in the underwater region 10. For example, an electrical breakdown in a given type of underwater capable employing a given type of polymer insulation results in certain chemical breakdown by-products being ejected into the underwater region 10 together with bubble formation resulting in a characteristic type of acoustic noise as well as electric fields in the underwater region having a specific spatial orientation. The processing arrangement 40 is operable to identify specific types of chemical, acoustic and electric field signatures of specific categories of electrical fault present in the underwater region 10, for example by cross-correlation and/or neural network-type processing executed in the processing arrangement 40.

The one or more chemical sensors 800 in combination with the hydrophone sensor arrangement 200 are, for example, capable of enabling the underwater probe assembly 20 to detect leaks from submerged pipes whilst simultaneously verifying whether or not electrical faults are present. In such a manner of operation, the underwater probe assembly 20 is capable of providing more comprehensive diagnostic services.

The underwater probe assembly 20 is beneficially provided with operating electrical power via the one or more flexible connections 30. Alternatively, or additionally, the underwater probe assembly 20 includes its own source of power, for example one or more rechargeable batteries; lithium-ion-polymer batteries, nickel-metal hydride (NiMH) batteries and even sealed gel lead-acid batteries are suitable for providing electric power for operating the underwater probe assembly 20. Use of batteries in the probe assembly 20 is an advantage in that spurious induced electrical signals in water in a vicinity of the probe assembly 20 associated with power supply via the one or more flexible connections 30 to the probe assembly 20 are susceptible to being reduced.

Although use of the hydrophone assembly 200 in a phased-array mode has been described in the foregoing, the underwater probe assembly 20 is also optionally operable to monitor signals generated from individual hydrophones of the hydrophone assembly 200 for identifying a spatial location of a source of acoustic energy in a vicinity of the probe assembly 20.

Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural.

Numerals included within parentheses in the accompanying claims are intended to assist understanding of the claims and should not be construed in any way to limit subject matter claimed by these claims.

The invention claimed is:

1. An underwater measurement system for condition monitoring of submerged structures and equipment in an underwater region, said system including an underwater probe assembly equipped with a sensor assembly operable to sense at least one physical variable in the submerged structures or equipment in the region for generating at least one corresponding sensor signal, and a data processing arrangement for processing the at least one sensor signal to generate processed data for presentation and/or logging, wherein:
   said sensor assembly includes one or more voltage sensors configured to sense electric fields present in the submerged structures or equipment in the underwater region and provide information in said at least one signal indicative of said electric fields, wherein said one or more voltage sensors are implemented as one or more pairs of electrodes operable to provide a differential voltage measurement, and said one or more pairs of electrodes are arranged to provide potential differential measurements in a plurality of mutually orthogonal directions;
   said sensor assembly comprises a plurality of hydrophones operable to receive sonic energy generated in the submerged structures or equipment in said underwater region and to include corresponding information in said at least one sensor signal for communicating, in real time, to said data processing arrangement;
   said plurality of hydrophones are configured as an array of hydrophones mounted on the underwater probe assembly, whose sonic sensing characteristic in operation has one or more preferred directions of sensitivity for enabling a direction of a source of sonic energy to be determined;
   said plurality of hydrophones constitute in operation a phased array of hydrophones whose polar sensitivity characteristics are electronically steerable from said data processing arrangement, wherein
   said data processing arrangement is operable to analyze said at least one sensor signal to determine a direction in which an electric field at a given signal frequency is orientated for assisting in determining a location of a source of the electric field of the submerged structures or equipment within the underwater region,
   said data processing arrangement is operable to compute one or more frequency spectra representative of said at least one sensor signal, and to display and/or log said one or more frequency spectra, and
   said data processing arrangement is operable to compare one or more harmonics of one or more signals generated by said plurality of hydrophones against one or more harmonics of one or more signals generated by said one or more voltage sensors, for identifying differences therebetween for characterizing the submerged structures or equipment in the underwater region.

2. An underwater measurement system as claimed in claim 1, wherein said one or more pairs of electrodes are fabricated from an inert material which is not chemically reactive with saline water.

3. An underwater measurement system according to claim 1, wherein said sensor assembly includes one or more chemical sensors operable to detect one or more chemical species or components present in said underwater region and to include corresponding information in said at least one sensor signal for communicating to said data processing arrangement, said information being indicative of said sensed one or more chemical species or components.

4. An underwater measurement system as claimed in claim 1, wherein said data processing arrangement is operable to compare said one or more frequency spectra with one or more spectral templates for identifying one or more events occurring in the submerged structures or equipment in the underwater region.

5. An underwater measurement system according to claim 1, wherein said sensor assembly includes an inertial sensor for determining an orientation and/or position of said sensor assembly, said inertial sensor being coupled in communication with said data processing arrangement.

6. An underwater measurement system according to claim 1 adapted for executing passive detection of one or more electrical faults in the submerged structures or equipment in said underwater region.

7. An underwater measurement system according to claim 1, wherein said sensor assembly is mounted on the underwater probe assembly coupled via a communication connection to computing hardware, and said communication connection is a flexible umbilical connection enabling said probe assembly to be maneuvered within said underwater region.

8. An underwater measurement system as claimed in claim 7, wherein said data processing arrangement is distributed between said probe assembly and said computing hardware.

9. A method of for condition monitoring of submerged structures and equipment in an underwater region using an underwater measurement system, said system including a sensor assembly coupled in communication with a data processing arrangement, said method comprising the steps of:
   (a) using one or more voltage sensors of said sensor assembly to sense electric fields present in the submerged structures or equipment in the underwater region to generate at least one sensor signal including information indicative of said electric fields;
   (b) using a plurality of hydrophones of said sensor assembly to receive sonic energy generated in the submerged structures or equipment in said underwater region and to include corresponding information in said at least one sensor signal for communicating, in real time, to said data processing arrangement;
   (c) processing said at least one sensor signal in said data processing arrangement to enable monitoring of the submerged structures or equipment in said underwater region,
   wherein said method further includes:
   (d) configuring said plurality of hydrophones as an array of hydrophones whose sonic sensing characteristic in operation has one or more preferred directions of sensitivity for enabling a direction of a source of sonic energy to be determined;
   (e) using said plurality of hydrophones as a phased array of hydrophones; and (f) electronically steering polar sensitivity characteristics of said phased array from said data processing arrangement.

10. A method as claimed in claim 9, wherein said one or more voltage sensors are implemented as one or more pairs of electrodes operable to provide a differential voltage measurement in the submerged structures or equipment in said region.

11. A method as claimed in claim 10, including a step of providing differential measurements in a plurality of mutually orthogonal directions using said one or more pairs of electrodes.

12. A method according to claim 9, wherein said method includes a step of using said data processing arrangement to analyze said at least one sensor signal to determine a direction in which an electric field at a given signal frequency is orientated for assisting in determining a location of a source of the electric field within the submerged structures or equipment in the underwater region.

13. A method according to claim 9 further including steps of:
(g) detecting using one or more chemical sensors included in said underwater measurement system one or more chemical species or components present in said underwater region; and
(h) including corresponding information in said at least one sensor signal for communicating to said data processing arrangement, said information being indicative of said sensed one or more chemical species or chemicals.

14. A method according to claim 9 further including steps of:
(g) using said data processing arrangement to compute one or more frequency spectra representative of said at least one sensor signal; and
(h) displaying and/or logging said one or more frequency spectra.

15. A method according to claim 14, wherein including a step of comparing in said data processing arrangement one or more harmonics of one or more signals generated by said plurality of hydrophones against one or more harmonics of one or more signals generated by said one or more voltage sensors, for identifying differences therebetween for characterizing the submerged structures or equipment in the underwater region.

16. A method according to 15, including comparing said one or more signals generated by said plurality of hydrophones against said one or more signals generated by said one or more voltage sensors, for monitoring slippage occurring in one or more rotating induction machines.

17. A method according to claim 15, including a step of using said data processing arrangement to compare said one or more frequency spectra with one or more spectral templates for identifying one or more events occurring in the submerged structures or equipment in the underwater region.

18. A method according to claim 9 including a step of using an inertial sensor of said sensor assembly for determining an orientation and/or position of said sensor assembly, said inertial sensor being coupled in communication with said data processing arrangement.

19. A method according to claim 9 adapted for executing passive detection of one or more electrical faults in the submerged structures or equipment in said underwater region.

20. A software product recorded on a non-transitory data carrier, said software being executable on computing hardware for implementing a method according to claim 9.

* * * * *